United States Patent
Li

(10) Patent No.: US 6,262,430 B1
(45) Date of Patent: Jul. 17, 2001

(54) INTEGRATED SYSTEM FOR FRONTSIDE NAVIGATION AND ACCESS OF MULTI-LAYER INTEGRATED CIRCUITS

(75) Inventor: Xia Li, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/126,066

(22) Filed: Jul. 30, 1998

(51) Int. Cl.[7] .................................................. H01J 37/30
(52) U.S. Cl. .................................... 250/492.3; 250/492.2
(58) Field of Search ........................... 250/492.3, 492.21, 250/492.2, 309, 307, 310

(56) References Cited

U.S. PATENT DOCUMENTS

| | | | |
|---|---|---|---|
| 5,093,572 | * 3/1992 | Hosono | 250/309 |
| 5,113,072 | * 5/1992 | Yamaguchi et al. | 250/309 |
| 5,576,542 | * 11/1996 | Kaga | 250/309 |
| 5,616,921 | * 4/1997 | Talbot et al. | 250/309 |
| 5,821,549 | * 10/1998 | Talbot et al. | 250/309 |
| 6,031,985 | * 2/2000 | Yoshida | 250/492.2 |

* cited by examiner

Primary Examiner—Kiet T. Nguyen
(74) Attorney, Agent, or Firm—Sawyer Law Group LLP

(57) ABSTRACT

Aspects for an integrated system for frontside navigation and access of a multi-layer integrated circuit device are described. In an exemplary embodiment, an integrated system includes a focused ion beam device, the focused ion beam device capable of accessing a desired layer in the multi-layer integrated circuit device. The system further includes an optical imaging device coupled substantially adjacent to the focused ion beam device, the optical imaging device assisting in navigating the multi-layer integrated circuit device from a frontside to a desired location for accessing of the desired layer by the focused ion beam device.

14 Claims, 2 Drawing Sheets

INTEGRATED SYSTEM FOR FRONTSIDE NAVIGATION AND ACCESS OF MULTI-LAYER INTEGRATED CIRCUITS

FIELD OF THE INVENTION

The present invention relates to multi-layer integrated circuits (ICs), and more particularly to navigation from a frontside of multi-layer ICs.

BACKGROUND OF THE INVENTION

As the size of transistors forming integrated circuits decreases, the number of transistors in a given circuit area increases. The ability to locate one particular transistor in a circuit to perform repairs, for example, becomes significantly more difficult with the number and submicron size of the transistors. A typical approach for locating a particular circuit feature, i.e., transistor, in a silicon device utilizes a scanning electron microscope (SEM) system. While the SEM provides a high resolution topography of a top surface of a silicon device, internal metal interconnect and structure images are not provided by the SEM. Additionally, the common use of a polyimide layer as a protective top layer of silicon devices further inhibits the ability of the SEM to provide useful information for inspecting a device.

In conjunction with the SEM, a CAD (computer aided design) navigation tool typically aids in locating a particular feature of a silicon device. By registering three visible features, such as corner markings used as align marks, on SEM images of the silicon device with equivalent features of a device layout representation in the CAD tool, a position in the silicon device can be located by selecting a corresponding location coordinate in the CAD tool. Usually, this is accomplished by interfacing the computer system running the CAD tool with a stage holding the silicon device and driving the stage to the selected coordinate. Unfortunately, as a mechanical device, limitations exist in the accuracy of stage movement, e.g., to an accuracy of about 3 micron ($\mu$m). Of course, with feature sizes of the silicon device on the order of 0.25 $\mu$m, a difference of 3 $\mu$m will result in missing the desired feature completely.

A further limitation to using a CAD tool is the lack of availability of a layout for every possible circuit design. While an optical image can be taken for a given design to form an image of the structure and features of the design, the image must then be scanned into a computer system and registered with the corresponding SEM image of the silicon device. Such activities are considered too time-consuming and laborious to be a preferred practice.

Accordingly, a need exists for a navigation system that assists in more accurately locating particular features of multi-layer IC devices. The present invention addresses such a need.

SUMMARY OF THE INVENTION

The present invention provides aspects for an integrated system for frontside navigation and access of a multi-layer integrated circuit device. In an exemplary embodiment, an integrated system includes a focused ion beam (FIB) device, the focused ion beam device capable of accessing a desired layer in the multi-layer integrated circuit device. The system further includes an optical imaging device coupled substantially adjacent to the focused ion beam device, the optical imaging device assisting in navigating the multi-layer integrated circuit device from a frontside to a desired location for accessing of the desired layer by the focused ion beam device.

Through the present invention, more convenient identification of a relative position on a silicon device readily occurs by integrating an imaging device with an access and repair device. The imaging device allows better navigation from a frontside, since an operator can see where they are relative to a desired location in the circuit. These and other advantages of the aspects of the present invention will be more fully understood in conjunction with the following detailed description and accompanying drawings.

DETAILED DESCRIPTION

The present invention relates to an integrated system of assisted navigation for accessing desired locations of an IC from the frontside. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
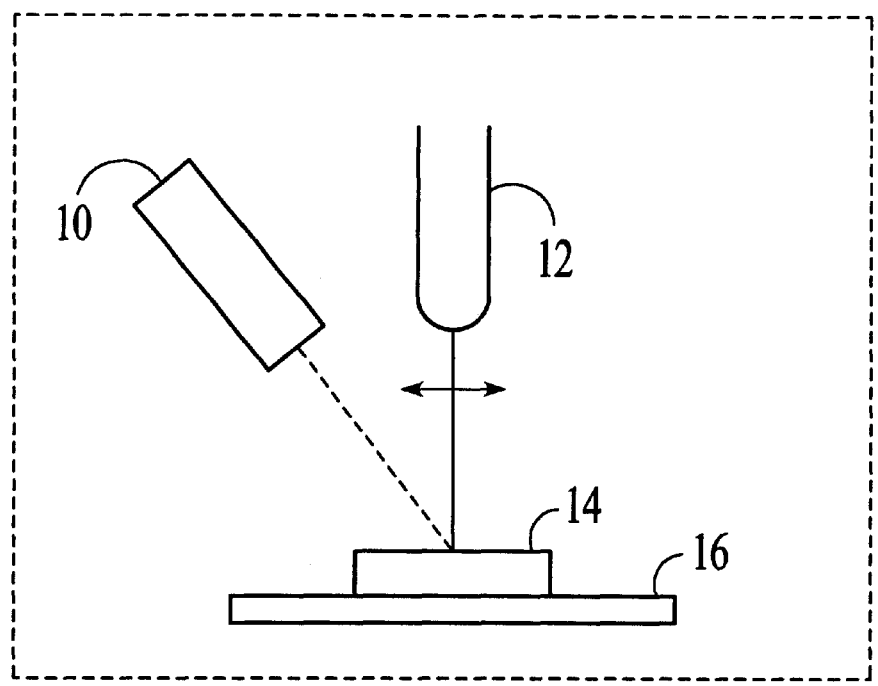
FIG. 1 illustrates an integrated system for frontside navigation and access of a multi-layer integrated circuit in accordance with the present invention.

FIG. 1 illustrates an integrated system 8 for frontside navigation and access of a multi-layer integrated circuit in accordance with the present invention. As shown, an optical device 10 is integrated in proximity to a FIB column 12 in the system 8. The optical device 10 suitably provides an optical image from a frontside of a multi-layer IC device 14 positioned on a driving stage 16. The FIB column 12 operates to mill through the IC 14 to reach a desired layer and can also be utilized to repair the desired layer, as is standardly known in the art. Locating the feature to be accessed with the FIB 12 preferably occurs through the use of the optical device 10 for viewing the IC device 14, as discussed more fully hereinbelow.

Figure 2:
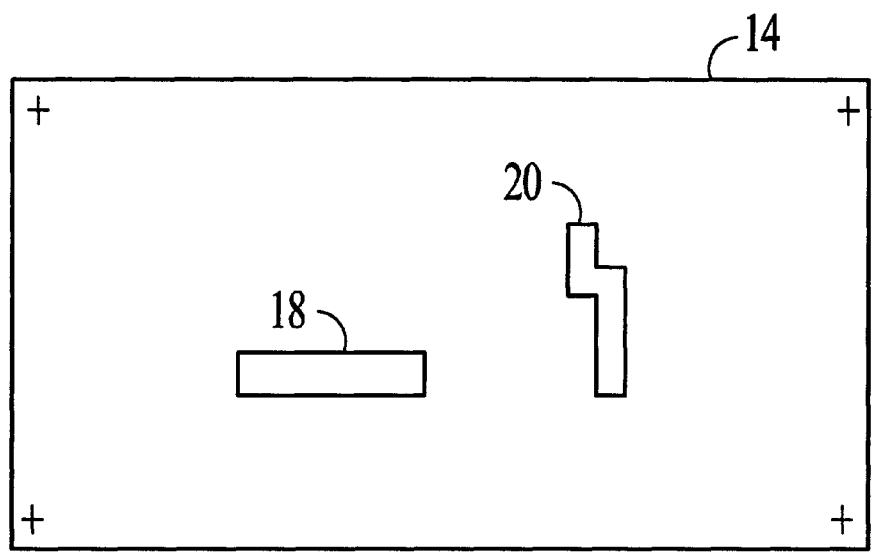
FIG. 2 illustrates a top-view diagram of the multi-layer IC including two landmarks.

FIG. 2 illustrates a top-view diagram of the multi-layer IC 14 including two landmarks 18 and 20, e.g., two top layer metal buses, in the vicinity of the desired location, as would be seen using the optical device portion 10 of the integrated system of FIG. 1. The landmarks, e.g., 18 and 20, capably act as visible reference points of the IC layout that preferably provide enough information to assist in precisely locating a location on the IC 14.

Figure 3:
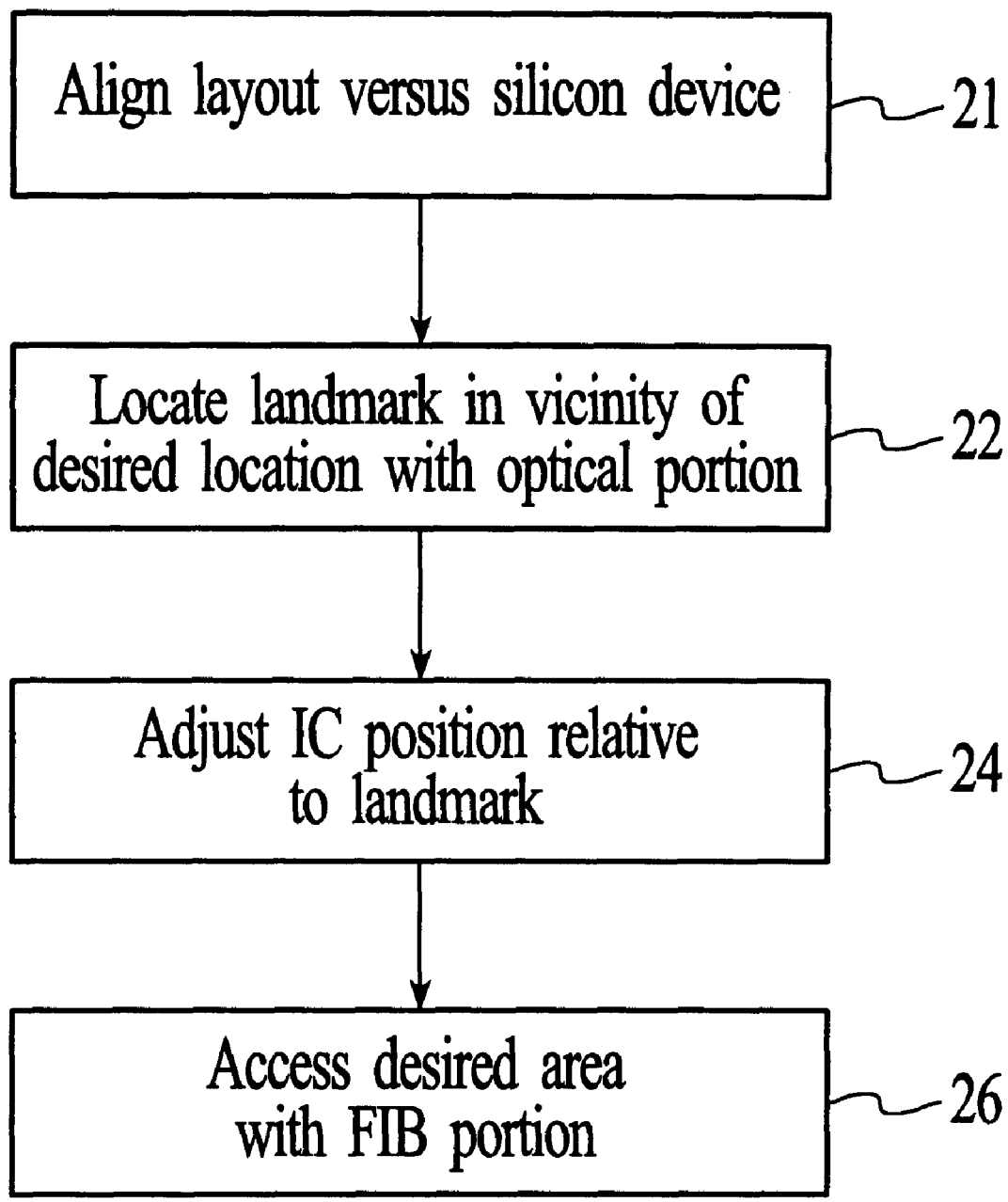
FIG. 3 illustrates a block flow diagram of a sequence of utilization of the integrated system of the present invention.

FIG. 3 illustrates a block flow diagram of a sequence of utilization of the integrated system of the present invention. Initially, the optical device 10 is utilized to view the IC and locate three recognizable features, such as corner markings on the IC 14 for layout versus silicon device alignment purposes (step 21). After alignment is achieved, preferably the stage 16 moves the IC device 14 to the vicinity of the desired location through a CAD navigation system (not shown) associated with integrated system 8. The landmarks are readily seen via the optical portion 10 in the vicinity of the desired location (step 22). Based on the optical viewing, the positioning of the IC 14 is then adjusted (step 24). Suitably, the driving stage 16 is moved in an appropriate direction and distance to match the identified landmark (e.g., 18 and 20, FIG. 2) seen with optical device 10 to the corresponding landmarks of the IC layout superimposed on a computer screen associated with the FIB 12, as is well understood by those skilled in the art. The layout of IC 14 is preferably known in order to be able to adjust the positioning properly to reach the desired feature. Movement of the driving stage 16 capably occurs through a typical controllable driver/motor mechanism, as is commonly used for stage driving. Once positioning is completed, accessing of the feature occurs, such as for repair, using the FIB column 12 (step 26). The actual depth of access and repair performed depends upon the needs of a particular circuit, as is well understood by those skilled in the art. By way of example, repairs that may be done include circuit rerouting by connecting and cutting metal interconnects.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. An integrated system for frontside navigation and access of a multi-layer integrated circuit device, the system comprising:

a focused ion beam device, the focused ion beam device capable of milling to a desired layer in the multi-layer integrated circuit device from the front side of the integrated circuit device; and an optical imaging device coupled substantially adjacent to the focused ion beam device, the optical imaging device assisting in navigating the multi-layer integrated circuit device from a front side to a desired location for accessing of the desired layer by the focused ion beam device.

2. The system of claim 1 further comprising a stage for holding the multi-layer integrated circuit device and adjusting a positioning of the multi-layer integrated circuit device.

3. The system of claim 1 wherein the optical imaging device provides a viewable image of at least one landmark on the multi-layer integrated circuit device for assisting in the navigation of the multi-layer integrated circuit device.

4. The system of claim 3 wherein the at least one landmark further comprises a top layer metal bus.

5. The system of claim 1 wherein the focused ion beam device mills through the multi-layer integrated circuit device to access the desired layer for chosen repair operations.

6. A method for improved navigation and access of a multi-layer integrated circuit device from a front side, the method comprising:

locating at least one identifiable landmark of the multi-layer integrated circuit device with an optical imaging device portion of an integrated system;

adjusting a position of the multi-layer integrated circuit device to a desired location relative to the located at least one identifiable landmark; and accessing in the multi-layer integrated circuit device at the desired location and through the front side with a focused ion beam portion of the integrated system.

7. The method of claim 6 further comprising aligning a layout of the multi-layer integrated circuit device with the multi-layer integrated circuit device before locating the at least one identifiable landmark.

8. The method of claim 6 wherein at least one identifiable landmark further comprises a top layer metal bus.

9. The method of claim 6 wherein accessing further comprises performing a chosen repair function.

10. The method of claim 9 wherein performing a chosen repair function further comprises multi-layer integrated circuit device rerouting.

11. The method of claim 6 further comprising providing the optical imaging device substantially adjacent to the focused ion beam portion of the integrated system.

12. A method for providing assisted navigation when accessing a multi-layer integrated circuit device from a front side, the method comprising:

providing an optical imaging device substantially adjacent with a focused ion beam column to form an integrated system; and utilizing the optical imaging device to locate at least one identifiable landmark on a multi-layer integrated circuit device for assisting in navigation to a desired location on the multi-layer integrated circuit device for access by the focused ion beam column through the front side of the integrated circuit device.

13. The method of claim 12 wherein utilizing further comprises utilizing on a frontside of the multi-layer integrated circuit device.

14. The method of claim 12 further comprising performing repairs at the desired location with the focused ion beam column.

* * * * *